United States Patent
Huang et al.

(10) Patent No.: US 10,522,713 B2
(45) Date of Patent: *Dec. 31, 2019

(54) LIGHT-EMITTING DIODE (71) Applicant: XIAMEN SANAN OPTOELECTRONICS TECHNOLOGY CO., LTD., Xiamen (CN)

(72) Inventors: Guanying Huang, Xiamen (CN); Chun-Yi Wu, Xiamen (CN); Chaoyu Wu, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/147,873

(22) Filed: Oct. 1, 2018

(65) Prior Publication Data

US 2019/0044026 A1    Feb. 7, 2019

Related U.S. Application Data (63) Continuation-in-part of application No. 15/667,609, filed on Aug. 2, 2017, now Pat. No. 10,115,861, which is a continuation of application No. PCT/CN2016/097760, filed on Sep. 1, 2016.

(30) Foreign Application Priority Data

Oct. 19, 2015    (CN) .......................... 2015 1 0674946

(51) Int. Cl.
| | |
|---|---|
| *H01L 33/14* | (2010.01) |
| *H01L 33/38* | (2010.01) |
| *H01L 25/075* | (2006.01) |
| *H01L 33/06* | (2010.01) |
| *H01L 33/00* | (2010.01) |
| *H01L 33/30* | (2010.01) |

(52) U.S. Cl.
CPC .......... *H01L 33/14* (2013.01); *H01L 25/0753* (2013.01); *H01L 33/06* (2013.01); *H01L 33/38* (2013.01); *H01L 33/0062* (2013.01); *H01L 33/30* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS 10,115,861 B2 *    10/2018    Huang ................... H01L 33/14

* cited by examiner

*Primary Examiner* — Michael Lebentritt
(74) *Attorney, Agent, or Firm* — Syncoda LLC; Feng Ma (57) ABSTRACT

A light-emitting diode includes an epitaxial-laminated layer, including an n-type ohmic contact layer; a first n-type transition layer; a second n-type transition layer; an n-type confinement layer; an active layer; a p-type confinement layer; a p-type window layer; a first electrode over an upper surface of the epitaxial-laminated layer; and a conductive substrate located over a bottom surface of the epitaxial-laminated layer.

20 Claims, 7 Drawing Sheets

FIG. 5 forming an epitaxial-laminated layer, comprising from bottom to up: an n-type ohmic contact layer, a first n-type transition layer, an n-type etching-stop layer, a second n-type transition layer, an n-type confinement layer, an active layer, a p-type confinement layer, a p-type transition layer and a p-type window layer;

forming a p electrode on the upper surface of the p-type window layer;

forming a metal bonding layer above the bottom surface of the n-type ohmic contact layer, the portion right below the p electrode position extends upwards and passes through the n-type ohmic contact layer and the first n-type transition layer, till the n-type etching-stop layer, thus forming a current distribution adjustment structure so that the injected current would not flow towards the epitaxial-laminated layer right below the p electrode;

providing a conductive substrate and binding it with the formed metal bonding layer.

LIGHT-EMITTING DIODE

CROSS-REFERENCE TO RELATED APPLICATIONS

The present application is a continuation-in-art of, and claims priority to, U.S. patent application Ser. No. 15/667,609 filed on Aug. 2, 2017, which is a continuation of, and claims priority to, PCT/CN2016/097760 filed on Sep. 1, 2016, which claims priority to Chinese Patent Application No. 201510674946.0 filed on Oct. 19, 2015. The disclosures of these applications are hereby incorporated by reference in their entirety.

BACKGROUND

In recent years, light-emitting diode (LED) has been widely applied and plays a more and more important role in various fields such as display systems, lighting systems, and automobile tail lights.

SUMMARY

To improve luminance of an AlGaInP-based LED, various embodiments disclosed herein provide a new epitaxial structure and designs a new chip structure to improve luminance effect.

In an aspect, a light-emitting diode epitaxial structure is provided, including: a substrate, an epitaxial-laminated layer on the substrate, comprising from bottom to up: an n-type ohmic contact layer, a first n-type transition layer, an n-type etching-stop layer, a second n-type transition layer, an n-type confinement layer, an active layer, a p-type confinement layer, a p-type transition layer and a p-type window layer.

In some embodiments, the first n-type transition layer is an n-type AlGaInP material layer, with doping concentration of at least 7E17 and preferred value of 1E18, and the doping material can be Si, Te, with thickness of at least 1 μm and preferred value of 3 μm; doping concentration of the n-type etching-stop layer is at least 1E18 and the preferred value is 5E18, and the doping material can be Si, Te with thickness of at least 0.05 μm and preferred value of 0.1 μm; the second n-type transition layer is an n-type AlGaInP material layer, with doping concentration at least of 7E17 and preferred value of 1E18, and the doping material can be Si, Te with thickness at least of 0.03 μm and preferred value of 0.05 μm; doping concentration of the p-type window layer is at least 8E17 and preferred value is 1E18, and the doping material can be Mg, Zn, C with thickness at least of 5 μm and preferred value of 10 μm.

In another aspect, an LED chip structure is provided with the aforementioned epitaxial structure, including: an epitaxial-laminated layer, comprising from bottom to up: an n-type ohmic contact layer, a first n-type transition layer, an n-type etching-stop layer, a second n-type transition layer, an n-type confinement layer, an active layer, a p-type confinement layer, a p-type transition layer and a p-type window layer; a p electrode on the upper surface of the p-type window layer; a metal bonding layer above the bottom surface of the n-type ohmic contact layer, wherein, the portion corresponding to the p electrode position extends upwards and passes through the n-type ohmic contact layer and the first n-type transition layer, till the n-type etching-stop layer, thus forming a current distribution adjustment structure so that the injected current would not flow towards the epitaxial-laminated layer right below the p electrode; a conductive substrate located on the bottom surface of the metal bonding layer.

In some embodiments, material of the n-type etching-stop layer is InGaP, GaP, GaAs, AlInP, AlAs, or AlGaAs.

In some embodiments, relationship between area of the p electrode W1 and area of the current distribution adjustment structure W2 is: $1<W2/W1$.

In some embodiments, relationship between area of the p electrode W1 and area of the current distribution adjustment structure W2 is: $W2/W1=1.2$.

In some embodiments, relationship between the total thickness of the n-type etching-stop layer and the second n-type AlGaInP layer T1 and thickness of the first n-type AlGaInP layer T2 is: $5 \leq T2/T1 \leq 30$.

In some embodiments, relationship between the total thickness of the n-type etching-stop layer and the second n-type AlGaInP layer T1 and thickness of the first n-type AlGaInP layer T2 is: $6 \leq T2/T1 \leq 20$.

In some embodiments, relationship between the total thickness of the n-type etching-stop layer and the second n-type AlGaInP layer T1 and thickness of the first n-type AlGaInP layer T2 is: $T2/T1=20$.

In some embodiments, thickness of the p-type window layer is 5-10 μm.

In some embodiments, conductivity of the p-type window layer is higher than that of the first and second n-type transition layers.

In some embodiments, the aforementioned light-emitting diode also comprises a mirror system, located between the n-type ohmic contact layer and the metal bonding layer, which extends towards the current distribution adjustment structure and covers upper surface of the current distribution adjustment structure.

In some embodiments, the mirror system also extends and passes through the n-type ohmic contact layer to form a groove.

In another aspect, a fabrication method of an LED is provided, including the following steps: 1) forming an epitaxial-laminated layer via epitaxial growth, comprising from bottom to up: an n-type ohmic contact layer, a first n-type transition layer, an n-type etching-stop layer, a second n-type transition layer, an n-type confinement layer, an active layer, a p-type confinement layer, a p-type transition layer and a p-type window layer; 2) fabricating a p electrode on the upper surface of the p-type window layer; 3) fabricating a metal bonding layer on the bottom surface of the n-type ohmic contact layer, wherein, the portion right below the p electrode position extends upwards and passes through the n-type ohmic contact layer and the first n-type transition layer, till the n-type etching-stop layer, thus forming a current distribution adjustment structure so that the injected current would not flow towards the epitaxial-laminated layer right below the p electrode; 4) providing a conductive substrate and connecting the conductive substrate with the formed metal bonding layer.

The method can adopt substrate transfer technology for twice. At first, after step 2), bind the p-type window layer to the temporary substrate, and remove the growth substrate; and after 4), remove the temporary substrate.

In some embodiments, step 3) specifically includes: etching to remove the n-type ohmic contact layer and the first n-type transition layer right below the p electrode via yellow photochemical process, and stopping etching at the n-type etching-stop layer to form a groove; fabricating a metal bonding layer that fills in the groove structure on the bottom surface of the n-type ohmic contact layer to form a current distribution adjustment structure.

In some embodiments, step 3) also comprises fabrication of a mirror system, specifically: etching to remove the n-type ohmic contact layer and the first n-type transition layer right below the p electrode via yellow photochemical process, and stopping etch at the n-type etching-stop layer to form a groove; fabricating a mirror system on the bottom surface of the n-type ohmic contact layer, which extends towards the groove and covers the side wall and bottom of the groove; fabricating a metal bonding layer on the bottom surface of the mirror system, which fills the groove structure, and forms a current distribution adjustment structure. In some embodiments, the method also comprises: based on luminance efficiency of the light-emitting diode, prefer the ratio between the total thickness T1 of the n-type etching-stop layer and the second n-type transition layer and thickness of the first n-type transition layer T2.

In another aspect, a light-emitting system is provided including a plurality of the LEDs described above. The light-emitting system can be used, for example, in lighting, signage, display, etc.

Other features and advantages of various embodiments of the present disclosure will be described in detail in the following specification, and it is believed that such features and advantages will become more apparent in the specification or through implementations of various embodiments disclosed herein. The purposes and other advantages of the embodiments can be realized and obtained in the structures specifically described in the specifications, claims and drawings.

BRIEF DESCRIPTION OF THE DRAWINGS

The accompanying drawings, which are included to provide a further understanding of the various embodiments disclosed herein and to constitute a part of this specification, together with the embodiments, are therefore to be considered in all respects as illustrative and not restrictive. In addition, the drawings are merely illustrative, which are not drawn to scale.

In the drawings:
110, 210: conductive substrate; 120, 220: metal bonding layer; 130, 230: mirror system; 141, 241: n-type ohmic contact layer; 142: n-type transition layer; 143: n-type confinement layer; 144: active layer; 145: p-type confinement layer; 146: p-type AlGaInP layer; 147: window layer; 148: p-type ohmic contact layer; 151, 215: p electrode; 152, 252: n electrode; 242: first n-type transition layer; 243: n-type etching-stop layer; 244: second n-type transition layer; 245: n-type confinement layer; 246: active layer; 247: p-type confinement layer; 248: p-type AlGaInP layer; 249: window layer; 250: p-type ohmic contact layer; 253: n-type metal contact layer; 254: transparent conductive layer or metal extension finger; 260: current distribution adjustment structure; W1: width of the p electrode; W2: width of the current distribution adjustment structure; T1: total thickness of the n-type etching-stop layer and the second n-type transition layer; T2: thickness of the first n-type transition layer.

DETAILED DESCRIPTION

Various embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this invention.

Figure 1:
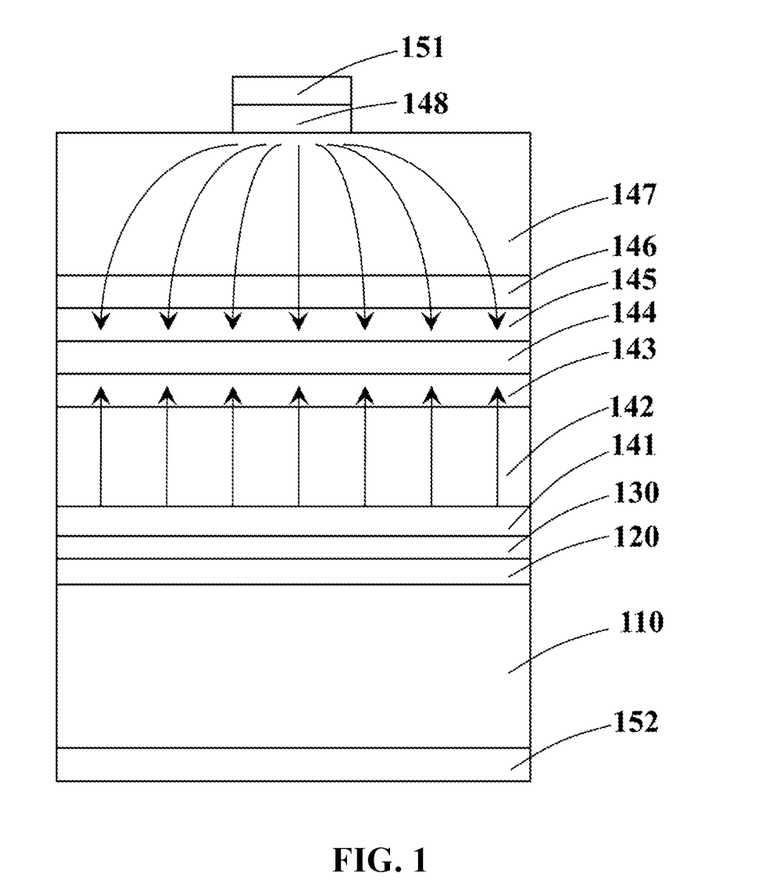
FIG. 1 illustrates a side sectional view of an AlGaInP-based light-emitting diode.
Figure 2:
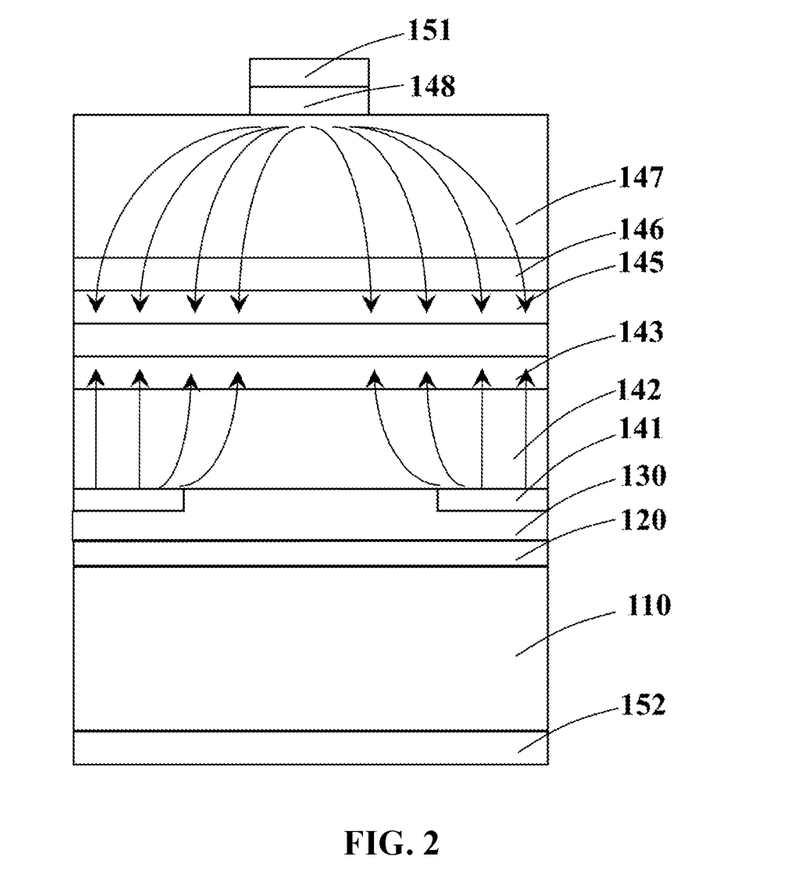
FIG. 2 illustrates a side sectional view of another AlGaInP-based light-emitting diode.
Figure 3:
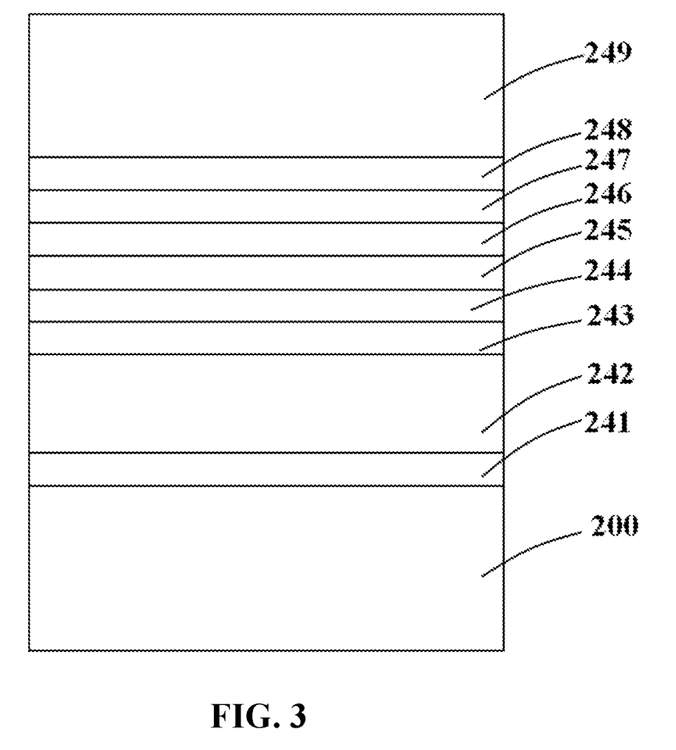
FIG. 3 illustrates a side sectional view of the light-emitting diode epitaxial structure according to some embodiments.

FIG. 1 illustrates an existing AlGaInP-based light-emitting diode structure, which increases luminance by transferring the light-absorbing GaAs substrate into a Si substrate via bonding. Due to overlapping region between the n-type ohmic contact layer and the p-type ohmic contact layer, the current under electrode is evenly distributed on the entire epitaxial structure. Therefore, the light emitted by the light-emitting layer under the p-electrode is absorbed by the p-electrode, thus leading to lower luminance. A structure as shown in FIG. 2 is provided. A non-overlapping design is made between the n-type ohmic contact layer and the p-type ohmic contact layer, so that current would not distribute below p-electrode, thus improving luminance. However, the luminance enhancing effect is insignificant in consideration of the relationship between epitaxial thickness and concentration. FIG. 3 illustrates an epitaxial structure of light-emitting diode according to some embodiments disclosed herein, comprising: a GaAs growth substrate 200, an n-type ohmic contact layer 241, a first n-type transition layer 242, an n-type etching-stop layer 243, a second n-type transition layer 244, an n-type confinement layer 245, an active layer 246, a p-type confinement layer 247, a p-type AlGaInP layer 248 and a p-type window layer 249.

In some embodiments, the growth substrate 200 is GaAs; the n-type ohmic contact layer 241 is GaAs; the first n-type transition layer 242 is n-AlGaInP, with doping concentration at least of 7E17 and preferred value of 1E18, and the doping material can be Si, Te with thickness at least of 1 µm and preferred value of 3 µm; material of the n-type etching-stop layer 243 can be InGaP, GaP, GaAs, AlInP, AlAs or AlGaAs, with doping concentration at least of 1E18 and preferred value of 5E18, and the doping material can be Si, Te with thickness at least of 0.05 µm and preferred value of 0.1 µm; the second n-type transition layer 244 is n-AlGaInP, with doping concentration at least of 7E17 and preferred value of 1E18, and the doping material can be Si, Te with thickness at least of 0.03 µm and preferred value of 0.05 µm; the n-type confinement layer 245 is AlGaInP; the active layer 246 is a multiple-quantum well structure; the p-type confinement layer 247 can be AlGaInP; the p-type AlGaInP layer 248 is 0.5-2 µm, and preferred value is 1 µm; the p-type window layer 249 is p-GaP, with doping concentration at least of 8E17 and preferred value of 1E18, and the doping material can be Mg, Zn, C, with thickness at least of 5 µm and preferred value of 10 µm.

Figure 4:
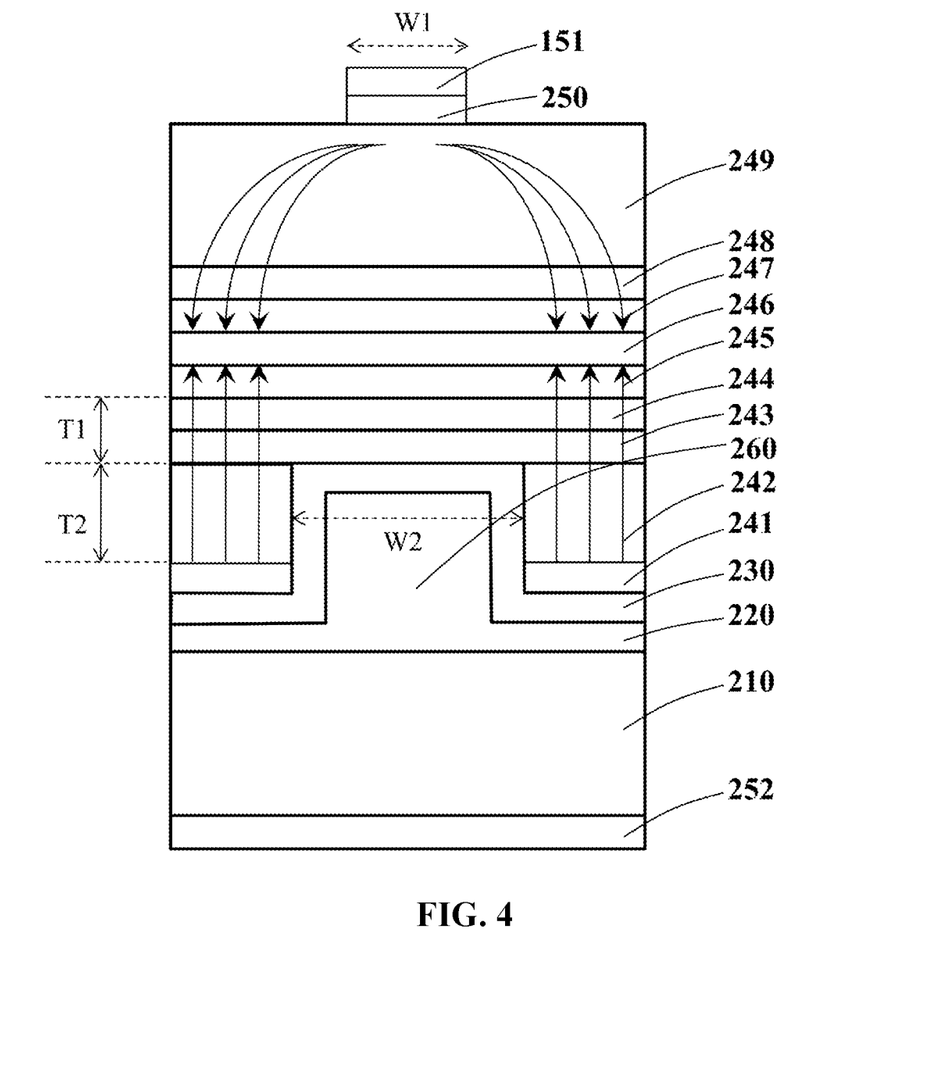
FIG. 4 illustrates a side sectional view of the light-emitting diode structure with the epitaxial structure as shown in FIG. 3.

FIG. 4 shows a light-emitting diode chip structure with the above epitaxial structure, comprising from bottom to up: an n electrode 252, a conductive substrate 210, a metal bonding layer 220, a mirror system 230, an n-type ohmic contact layer 241, a first n-type transition layer 242, an n-type etching-stop layer 243, a second n-type transition layer 244, an n-type confinement layer 245, an active layer 246, a p-type confinement layer 247, a p-type AlGaInP layer 248, a p-type window layer 249, a p-type ohmic contact layer 250 and a p electrode 251.

Wherein, the portion of the mirror system 230 located right below the p electrode 251 extends upwards and passes through the n-type ohmic contact layer 241 and the first n-type AlGaInP layer 242, till the n-type etching-stop layer 243 to form a groove; the metal bonding layer fills in the groove to form a current distribution adjustment structure 260 so that injected current would not flow to the epitaxial-laminated layer right below the p electrode. FIG. 4 further shows the distribution of the current, with the downward arrows indicating a flow of holes and the upward arrows indicating a flow of electrons.

With reference to FIG. 4, in this embodiment, width of the current distribution adjustment structure width W2 is larger than the width of p electrode W1, thereby ensuring that no current is flowed to the epitaxial-laminated layer right below the p electrode.

Figure 5:
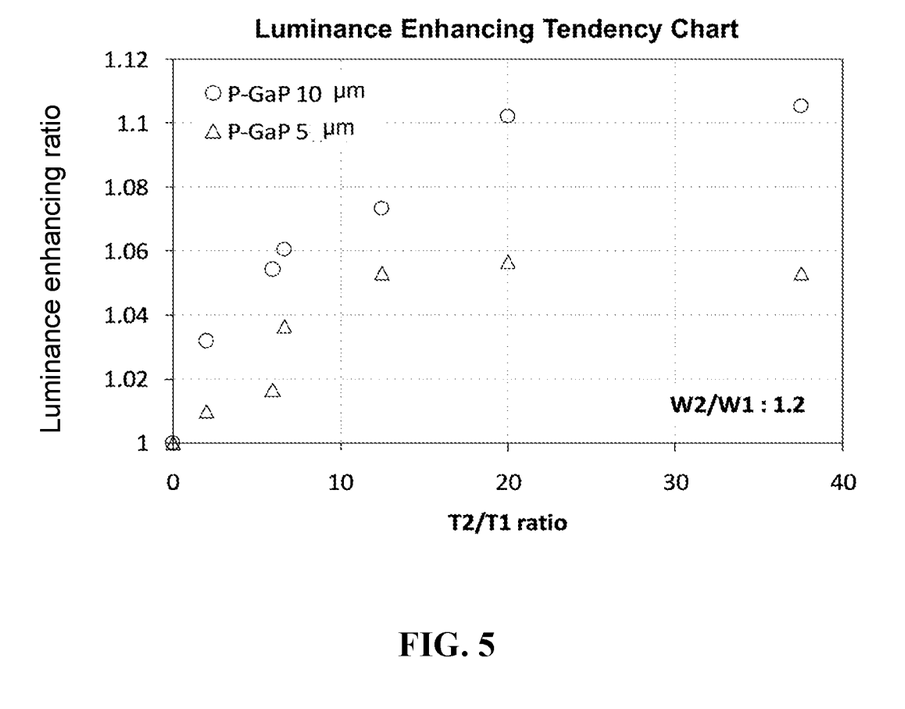
FIG. 5 shows a luminance enhancing tendency chart of the light-emitting diode according to some embodiments.

Further, in this embodiment, preferred ratios between the total thickness T1 of the n-type etching-stop layer and the second n-type transition layer and thickness of the first n-type transition layer T2 are selected based on the LED light emission efficiency. FIG. 5 shows the luminance enhancing tendency of the embodiment. Specifically, under fixed W2/W1=1.2, luminance of light-emitting diode will increase as ratio T2/T1 increases and tends to be stable when T2/T1≥20; therefore, T2/T1 ratio is preferred to be 20.

Figure 6:
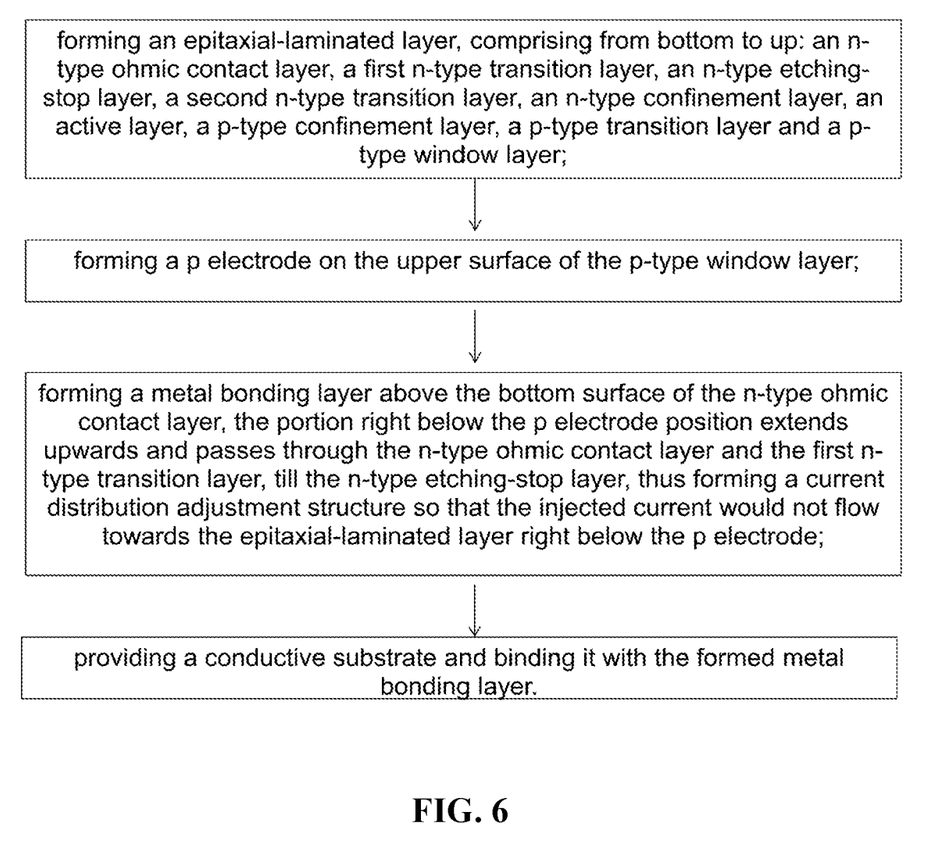
FIG. 6 shows a flow chart of the fabrication method of the light-emitting diode according to some embodiments.

Detailed descriptions will be given to the fabrication method for the light-emitting diode with reference to FIG. 6.

First, form an epitaxial structure as shown in FIG. 3 through epitaxial growth; second, fabricate a p-type ohmic contact layer 250 and a p electrode 251 on the surface of the p-type window layer 249; next, bind the p-type window layer 249 with a temporary substrate (such as glass substrate) via electric resin and remove the growth substrate 200 to expose the n-type ohmic contact layer; next, etch to remove the n-type ohmic contact layer 241 and the first n-type transition layer 242 right below the p electrode via yellow photochemical process; stop etching at the n-type etching-stop layer 243 to form a groove. Specifically, heat 50° C. etching solution with HCL:H2O:H2O2(1:20:1.5) to etch the n-type ohmic contact layer 241 and the first n-type transition layer 242; stop effective etching at the n-type etching-stop layer 243 to form a current distribution adjustment structure through selection ratio of material the n-type etching-stop layer 243 for the etching solution. The structure is wider than the p electrode. Then, fabricate a mirror system and a metal bonding layer; at last, provide a conductive substrate 210, and connect it to the formed metal bonding layer 220, and remove the temporary substrate to form a light-emitting diode.

Figure 7:
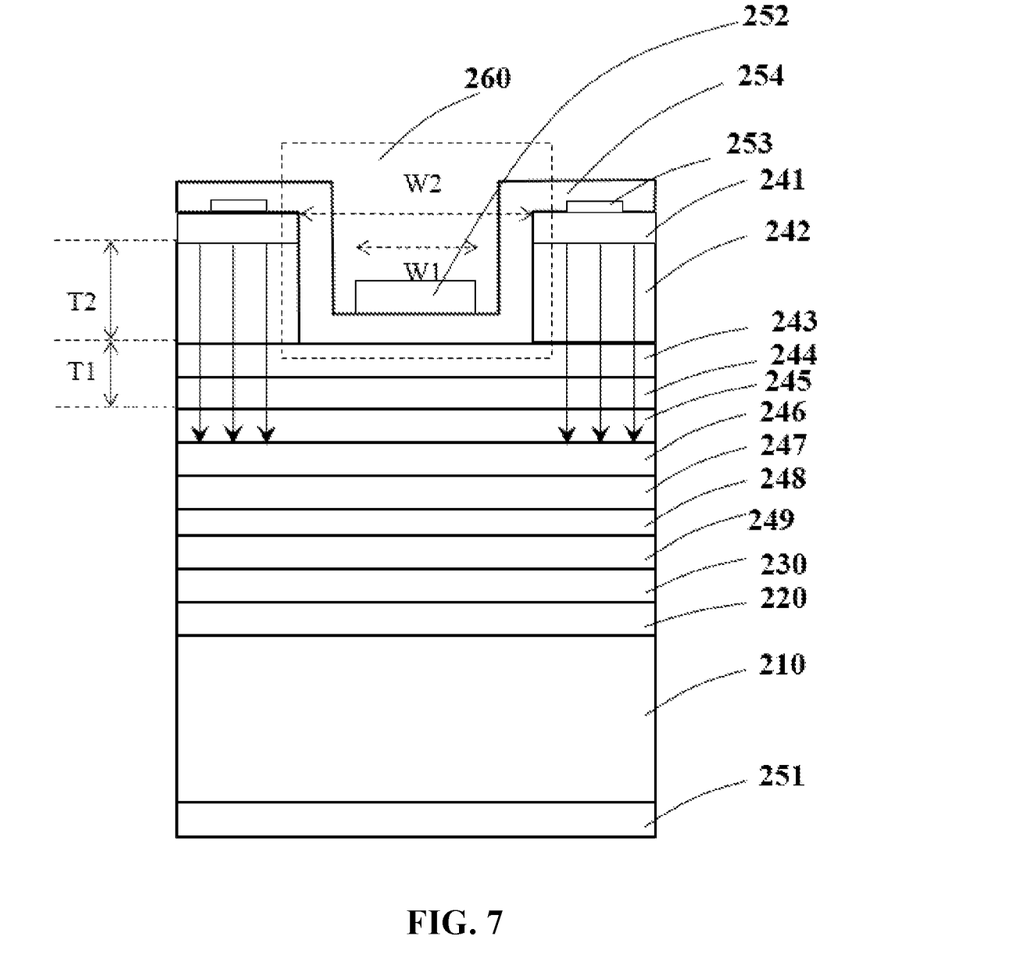
FIG. 7 illustrates a side sectional view of the light-emitting diode structure according to some embodiments.

FIG. 7 shows a light-emitting diode according to some embodiments disclosed herein, which includes, from bottom to top, a p-electrode 251, a conductive substrate 210, a metal bonding layer 220, a mirror system 230, a p-type window layer 249, and a p-type AlGaInP layer 248, a p-type confinement layer 247, an active layer 246, an n-type confinement layer 245, a second n-type transition layer 244, an n-type etch stop layer 243, a first n-type transition layer 242, an n-type ohmic contact layer 241, an n-type metal contact layer 253, a transparent conductive layer (or a metal extension finger) 254 and an n-electrode 252. The n-type ohmic contact layer 241 and the first n-type transition layer 242 under the n-electrode 252 (the pad region) are removed, and the transparent conductive layer 254 is in direct contact with the n-type etch stop layer 243 in the n-type electrode pad region, and form an ohmic contact with the n-type ohmic contact layer 241 through the n-type metal contact layer 253 in the non-electrode region, thereby forming an adjustment current distribution structure 260 in the n-type electrode region, so that when the current is injected, the current does not flow to the epitaxial stack directly under the n type electrode, the arrows in FIG. 7 show a flow of electrons. In the embodiment, the thickness of the p-type window layer 249 is preferably 0.5 μm or less, and may be, for example, 0.2 μm.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
an epitaxial-laminated layer, including:
an n-type ohmic contact layer;
a first n-type transition layer;
a second n-type transition layer;
an n-type confinement layer;
an active layer;
a p-type confinement layer;
a p-type window layer;
a first electrode over an upper surface of the epitaxial-laminated layer; and
a conductive substrate located over a bottom surface of the epitaxial-laminated layer.

2. The light-emitting diode of claim 1, wherein: a thickness of the first n-type transition layer is greater than a thickness of the second n-type transition layer.

3. The light-emitting diode of claim 1, wherein: the first and the second n-type transition layers comprise an AlGaInP layer.

4. The light-emitting diode of claim 1, further comprising a conductive layer over a surface of the n-type ohmic contact layer, wherein: a portion of the n-type ohmic contact layer and the first n-type transition layer are removed, thereby forming a current distribution adjustment structure such that injected current does not flow towards a portion of the epitaxial-laminated layer.

5. The light-emitting diode of claim 4, wherein: the first electrode is corresponding to a position of the current distribution adjustment structure.

6. The light-emitting diode of claim 5, wherein: a relationship between a width of the first electrode W1 and a width of the current distribution adjustment structure W2 is: 1<W2/W1.

7. The light-emitting diode of claim 5, wherein: a relationship between an area of the first electrode W1 and an area of the current distribution adjustment structure W2 is: W2/W1=1.2.

8. The light-emitting diode of claim 4, wherein: the conductive layer is over an upper surface of the n-type ohmic contact layer, and the first electrode is on the conductive layer.

9. The light-emitting diode of claim 8, wherein: the conductive layer is a transparent conductive layer or a metal extension finger.

10. The light-emitting diode of claim 8, wherein: the conductive layer also extends and passes through the n-type ohmic contact layer to form a groove.

11. The light-emitting diode of claim 10, wherein: the first electrode is located in the groove.

12. The light-emitting diode of claim 8, wherein: a thickness of the p-type window layer is less than 0.5 μm.

13. The light-emitting diode of claim 4, wherein: the conductive layer is over a bottom surface of the n-type ohmic contact layer, and the first electrode is over an upper surface of the epitaxial-laminated layer.

14. The light-emitting diode of claim 13, wherein: the conductive layer is a metal bonding layer, and having a portion corresponding to a position of the first electrode that extends upwards and passes through the n-type ohmic contact layer and the first n-type transition layer, thereby forming the current distribution adjustment structure such that injected current does not flow towards the epitaxial-laminated layer underneath the first electrode.

15. The light-emitting diode of claim 14, further comprising a mirror system, located between the n-type ohmic contact layer and the metal bonding layer, which extends towards the current distribution adjustment structure and covers an upper surface of the current distribution adjustment structure.

16. The light-emitting diode of claim 1, further comprising a mirror system located between the epitaxial-laminated layer and the conductive substrate.

17. The light-emitting diode of claim 16, further comprising a second electrode over a bottom surface of the conductive substrate.

18. The light-emitting diode of claim 1, wherein: the epitaxial-laminated layer further an n-type etching-stop layer between the first n-type transition layer and the second n-type transition layer.

19. The light-emitting diode of claim 18, wherein: a relationship between a total thickness of the n-type etching-stop layer and the second n-type transition layer T1 and a thickness of the first n-type transition layer T2 is: $5 \leq T2/T1 \leq 30$.

20. A light-emitting system comprising a plurality of light-emitting diodes (LEDs), each LED including:
   an epitaxial-laminated layer, including:
      an n-type ohmic contact layer;
      a first n-type transition layer;
      a second n-type transition layer;
      an n-type confinement layer;
      an active layer;
      a p-type confinement layer;
      a p-type window layer;
      a first electrode over an upper surface of the epitaxial-laminated layer; and
      a conductive substrate located over a bottom surface of the epitaxial-laminated layer.

* * * * *